(12) United States Patent
Atir et al.

(10) Patent No.: US 7,755,938 B2
(45) Date of Patent: Jul. 13, 2010

(54) METHOD FOR READING A MEMORY ARRAY WITH NEIGHBOR EFFECT CANCELLATION

(75) Inventors: Shahar Atir, Herzlia (IL); Oleg Dadashev, Hadera (IL); Yair Sofer, Tel-Aviv (IL); Eduardo Maayan, Kfar Saba (IL)

(73) Assignee: Saifun Semiconductors Ltd., Netanya (IL)

( * ) Notice: Subject to any disclaimer, the term of this patent is extended or adjusted under 35 U.S.C. 154(b) by 528 days.

(21) Appl. No.: 10/826,375

(22) Filed: Apr. 19, 2004

(65) Prior Publication Data

US 2005/0232024 A1     Oct. 20, 2005

(51) Int. Cl.
G11C 16/04     (2006.01)
(52) U.S. Cl. .............................. 365/185.02; 365/185.16
(58) Field of Classification Search ........ 365/185.02 O, 365/185.16 X, 189.04, 189.07, 185.02, 185.16
See application file for complete search history.

(56) References Cited

U.S. PATENT DOCUMENTS

| | | | |
|---|---|---|---|
| 4,342,102 A | 7/1982 | Puar | |
| 4,388,705 A | 6/1983 | Sheppard | |
| 4,389,705 A | 6/1983 | Sheppard | |
| 4,807,188 A * | 2/1989 | Casagrande | 365/185.05 |
| 4,992,980 A * | 2/1991 | Park et al. | 365/185.16 |
| 5,027,321 A | 6/1991 | Park | |
| 5,142,496 A | 8/1992 | Van Buskirk | |
| 5,241,497 A | 8/1993 | Komarek | |
| 5,276,646 A | 1/1994 | Kim et al. | |
| 5,289,412 A | 2/1994 | Frary et al. | |
| 5,305,262 A | 4/1994 | Yoneda | |
| 5,335,198 A | 8/1994 | Van Buskirk et al. | |
| 5,345,425 A | 9/1994 | Shikatani | |
| 5,361,343 A | 11/1994 | Kosonocky et al. | |
| 5,381,374 A | 1/1995 | Shiraishi et al. | |
| 5,418,743 A | 5/1995 | Tomioka et al. | |
| 5,450,341 A | 9/1995 | Sawada et al. | |
| 5,450,354 A | 9/1995 | Sawada et al. | |
| 5,477,499 A | 12/1995 | Van Buskirk et al. | |
| 5,508,968 A | 4/1996 | Collins et al. | |
| 5,521,870 A | 5/1996 | Ishikawa | |
| 5,537,358 A | 7/1996 | Fong | |
| 5,544,116 A | 8/1996 | Chao et al. | |
| 5,568,085 A | 10/1996 | Eitan et al. | |
| 5,583,808 A | 12/1996 | Brahmbhatt | |
| 5,627,790 A | 5/1997 | Golla et al. | |
| 5,633,603 A | 5/1997 | Lee | |
| 5,657,332 A | 8/1997 | Auclair et al. | |
| 5,694,356 A | 12/1997 | Wong et al. | |
| 5,712,815 A | 1/1998 | Bill et al. | |
| 5,717,632 A | 2/1998 | Richart et al. | |
| 5,748,534 A | 5/1998 | Dunlap et al. | |
| 5,754,475 A | 5/1998 | Bill et al. | |

(Continued)

FOREIGN PATENT DOCUMENTS

EP     0740307     10/1996

(Continued)

*Primary Examiner*—VanThu Nguyen
(74) *Attorney, Agent, or Firm*—Eitan Mehulal Law Group

(57) ABSTRACT

Disclosed is a method of reducing the neighbor effect while reading data in a non-volatile memory array. The method includes sensing adjacent memory cells. The sensing of the two adjacent cells is performed substantially simultaneously and through at least a partially shared sensing path.

9 Claims, 10 Drawing Sheets

U.S. PATENT DOCUMENTS

| | | | |
|---|---|---|---|
| 5,768,193 A | 6/1998 | Lee et al. | |
| 5,771,197 A | 6/1998 | Kim | |
| 5,784,314 A | 7/1998 | Sali et al. | |
| 5,805,500 A | 9/1998 | Campardo et al. | |
| 5,812,456 A | 9/1998 | Hull et al. | |
| 5,828,601 A | 10/1998 | Hollmer et al. | |
| 5,831,892 A * | 11/1998 | Thewes et al. | 365/94 |
| 5,841,700 A | 11/1998 | Chang | |
| 5,847,441 A | 12/1998 | Cutter et al. | |
| 5,867,429 A | 2/1999 | Chen et al. | |
| 5,886,927 A | 3/1999 | Takeuchi | |
| 5,936,888 A | 8/1999 | Sugawara | |
| 5,940,332 A | 8/1999 | Artieri | |
| 5,946,258 A | 8/1999 | Evertt et al. | |
| 5,949,728 A | 9/1999 | Liu et al. | |
| 5,969,993 A | 10/1999 | Takeshima | |
| 5,982,666 A | 11/1999 | Campardo | |
| 5,986,940 A | 11/1999 | Atsumi et al. | |
| 6,044,019 A | 3/2000 | Cernea et al. | |
| 6,044,022 A | 3/2000 | Nachumovsky | |
| 6,084,794 A | 7/2000 | Lu et al. | |
| 6,088,265 A * | 7/2000 | Ohta | 365/185.16 |
| 6,108,240 A | 8/2000 | Lavi et al. | |
| 6,118,692 A | 9/2000 | Banks | |
| 6,128,226 A | 10/2000 | Eitan et al. | |
| 6,134,156 A | 10/2000 | Eitan | |
| 6,147,904 A | 11/2000 | Liron | |
| 6,169,691 B1 | 1/2001 | Pasotti et al. | |
| 6,185,143 B1 | 2/2001 | Perner et al. | |
| 6,201,737 B1 | 3/2001 | Hollmer et al. | |
| 6,205,056 B1 | 3/2001 | Pan et al. | |
| 6,222,762 B1 | 4/2001 | Guterman et al. | |
| 6,233,180 B1 | 5/2001 | Eitan et al. | |
| 6,240,040 B1 | 5/2001 | Akaogi et al. | |
| 6,252,799 B1 | 6/2001 | Liu et al. | |
| 6,282,133 B1 | 8/2001 | Nakagawa et al. | |
| 6,285,589 B1 | 9/2001 | Kajitani | |
| 6,331,950 B1 | 12/2001 | Kuo et al. | |
| 6,351,415 B1 | 2/2002 | Kushnarenko | |
| 6,469,929 B1 | 10/2002 | Kushnarenko et al. | |
| 6,469,935 B2 | 10/2002 | Hayashi | |
| 6,496,414 B2 | 12/2002 | Kasa et al. | |
| 6,510,082 B1 | 1/2003 | Le et al. | |
| 6,525,969 B1 | 2/2003 | Kurihara et al. | |
| 6,529,412 B1 | 3/2003 | Chen et al. | |
| 6,535,434 B2 | 3/2003 | Maayan et al. | |
| 6,574,139 B2 | 6/2003 | Kurihara | |
| 6,594,181 B1 | 7/2003 | Yamada | |
| 6,636,440 B2 | 10/2003 | Maayan et al. | |
| 6,639,837 B2 | 10/2003 | Takano et al. | |
| 6,643,178 B2 | 11/2003 | Kurihara | |
| 6,650,568 B2 | 11/2003 | Iijima | |
| 6,975,536 B2 * | 12/2005 | Maayan et al. | 365/185.16 |
| 2002/0004878 A1 | 1/2002 | Norman | |
| 2002/0071313 A1 | 6/2002 | Takano et al. | |
| 2002/0132436 A1 | 9/2002 | Eliyahu et al. | |
| 2002/0191465 A1 | 12/2002 | Maayan et al. | |
| 2003/0117841 A1 | 6/2003 | Yamashita | |
| 2003/0117861 A1 | 6/2003 | Maayan et al. | |
| 2003/0142544 A1 | 7/2003 | Maayan et al. | |
| 2003/0208663 A1 | 11/2003 | Van Buskirk et al. | |
| 2003/0214844 A1 | 11/2003 | Iijima | |
| 2004/0008541 A1 | 1/2004 | Maayan et al. | |
| 2004/0012993 A1 | 1/2004 | Kurihara | |
| 2004/0013000 A1 | 1/2004 | Torii | |

FOREIGN PATENT DOCUMENTS

| | | |
|---|---|---|
| EP | 1126468 | 8/2001 |
| EP | 1164597 | 12/2001 |
| EP | 0656628 | 4/2003 |
| JP | 408106791 | 4/1996 |
| JP | 2002218488 | 8/2002 |
| WO | WO 00/46808 | 8/2000 |
| WO | WO 03/036651 | 5/2003 |
| WO | WO 03/063168 | 7/2003 |
| WO | WO 03/088261 | 10/2003 |

* cited by examiner

METHOD FOR READING A MEMORY ARRAY WITH NEIGHBOR EFFECT CANCELLATION

FIELD OF THE INVENTION

The present invention relates generally to memory arrays and particularly to a method of reading information with neighbor effect cancellation in such memory arrays.

BACKGROUND OF THE INVENTION

Memory devices, such as random access memory (RAM), read-only memory (ROM), non-volatile memory (NVM) and like, are known in the art. These devices typically provide an indication of the data stored therein by providing a readout electrical signal. A sense amplifier may be used for detecting the signal and determining the logical content of the memory cell being read.

In general, sense amplifiers determine the logical value stored in a cell by comparing the output signal of the cell with a reference level. If the output signal is above the reference level, the cell is determined to be in one state, e.g., erased, and if the output is below the reference level, the cell is determined to be in another state, e.g., programmed. The reference level is typically set as a voltage or current level between the expected erased and programmed output signal voltage or current levels, and is sufficiently far from both output signal levels, so that noise on the output signal of the memory cell being read will not produce false results. As an example, the expected memory cell output signal for its erased and programmed states may be 150 mV and 50 mV, respectively, and the reference level may be 100 mV. In this example, if different sources of noise sources sum up and generate a noise signal of about 50 mV or more then the cell may be erroneously read. To overcome such case, the noise signal generators should be suppressed or the margin between the erased and programmed state signals should be increased.

In a virtual ground (VG) array, the readout of a cell may depend on the state of its neighbor cells. Therefore, a change in the state of the neighbors of a cell may affect the cell readout reliability. This undesired effect is known in the art as the "neighbor effect" (NE). The NE will be better understood by reference to FIG. 1 which is a block diagram of NVM cells in a virtual ground (VG) array. Cell $MC_3$ in FIG. 1 is verified to be in a specific state, e.g., programmed or erased. When $MC_3$ is read, the signal developed at the reading node, for example, either in the drain side or in the source side of the cell, has two components: the current of the cell itself, and the current flowing to or from neighbor cells, depending if cell $MC_3$ is read from the source or from the drain. Neighbor cells may share the same word line of the cell being read and may be connected, either directly or through other cells, to the reading node. For example, in the configuration of FIG. 1, cells $MC_2$ and $MC_4$ are adjacent to cell $MC_3$. When one or more of the neighbor cells changes from an erased state to a programmed state or vice versa, the read-out current from $MC_3$ may exhibit a different signal at the reading node, because the current component of its neighbor cells has changed.

Thus, for example, if cell $MC_3$ is read out from its drain side (shown in FIG. 1) then after the state of $MC_2$ is changed from an erased state to a programmed state, its current "contribution" to the read-out current of $MC_3$ may change, and therefore, the read-out for $MC_3$ may exhibit a different signal at the reading node. A similar effect may happen, for example, after the state of $MC_4$ is likewise changed for the case of source-side read. If farther cells along the same word line change their state (e.g. $MC_1$, $MC_5$, $MC_6$, etc., not shown in FIG. 1) they may also affect the readout of $MC_3$. The influence on $MC_3$ of such changes in the states of cells $MC_1$, $MC_2$, $MC_4$, $MC_5$ and $MC_6$ may not necessarily be of equal magnitude and may depend on the readout scheme, i.e. drain-side read or source-side read.

A memory cell, such as $MC_3$ in FIG. 1, may be read from its drain side or its source side, i.e. the cell current or voltage signal may be sensed or derived from either its drain or source terminals. The NE may reduce the margin of a memory cell causing it to be read incorrectly in either of drain-side or source-side readout schemes.

Several ways to reduce the NE have previously been proposed. One such suggestion to reduce the NE is, for example, to insert a voltage level that nearly equalizes the drain and source voltage of one or more of the neighbor cells. Such method is described in U.S. Pat. Nos. 6,351,415 and 6,510,082. However, since the reading node being sensed is transient, and therefore, its slope and level depend on data, process, and temperature factors, the drain-source voltage of the neighbor cells is typically non-zero, and some neighbor current usually exists, resulting in only partial NE reduction.

Accordingly, there is a need for an efficient and reliable method for reading cells in a memory array.

SUMMARY OF THE INVENTION

There is provided in accordance with embodiments of the present invention a method of reading data in a virtual ground array of memory cells comprising sensing substantially simultaneously a state of adjacent memory cells, wherein the data stored in each cell of the adjacent memory cells is in an identical state or wherein a bit stored in each cell of the adjacent memory cells is in an identical state.

There is further provided in accordance with embodiments of the present invention a method wherein sensing substantially simultaneously the state of the adjacent memory cells comprises coupling a sense amplifier to a first source/drain terminal of each cell of the adjacent memory cells, setting a voltage at a second drain/source terminal of each cell of the adjacent cells to a read level, and sensing in a reading direction the state of the adjacent cells.

BRIEF DESCRIPTION OF THE DRAWINGS

The subject matter regarded as the invention is particularly pointed out and distinctly claimed in the concluding portion of the specification. The invention, however, both as to organization and method of operation, together with objects, features and advantages thereof, may best be understood by reference to the following non-limiting detailed description when read with the accompanied drawings in which:

FIG. 2A is a simplified block diagram of a source-side read operation and FIG. 2B is a simplified block diagram of a drain-side read operation;

FIG. 3A is a simplified block diagram of a source-side read operation and FIG. 3B is a simplified block diagram of a drain-side read operation;

Figure 1:
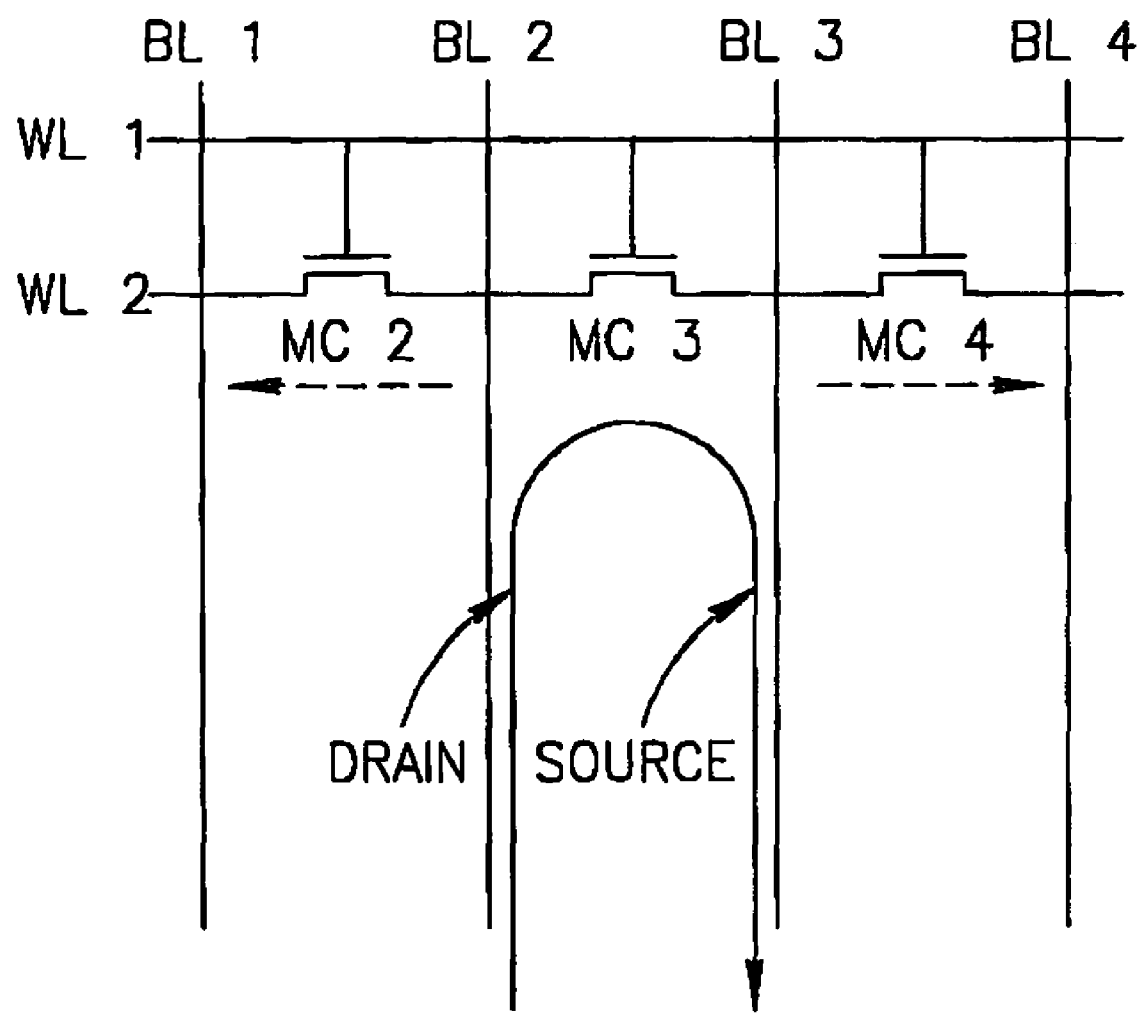
FIG. 1 is a simplified block diagram demonstrating the neighbor effect (NE) in non-volatile memory (NVM) cells in a virtual ground (VG) array.

It will be appreciated that for simplicity and clarity of these non-limiting illustrations, elements shown in the figures have not necessarily been drawn to scale. For example, the dimensions of some of the elements may be exaggerated relative to other elements for clarity. Further, where considered appropriate, reference numerals may be repeated among the figures to indicate corresponding or analogous elements.

DETAILED DESCRIPTION OF THE PRESENT INVENTION

In the following detailed description, numerous specific details are set forth in order to provide a thorough understanding of the invention. However, it will be understood by those of ordinary skill in the art that the present invention may be practiced without these specific details. In other instances, well-known methods and procedures have not been described in details so as not to obscure the present invention.

Figure 2A:
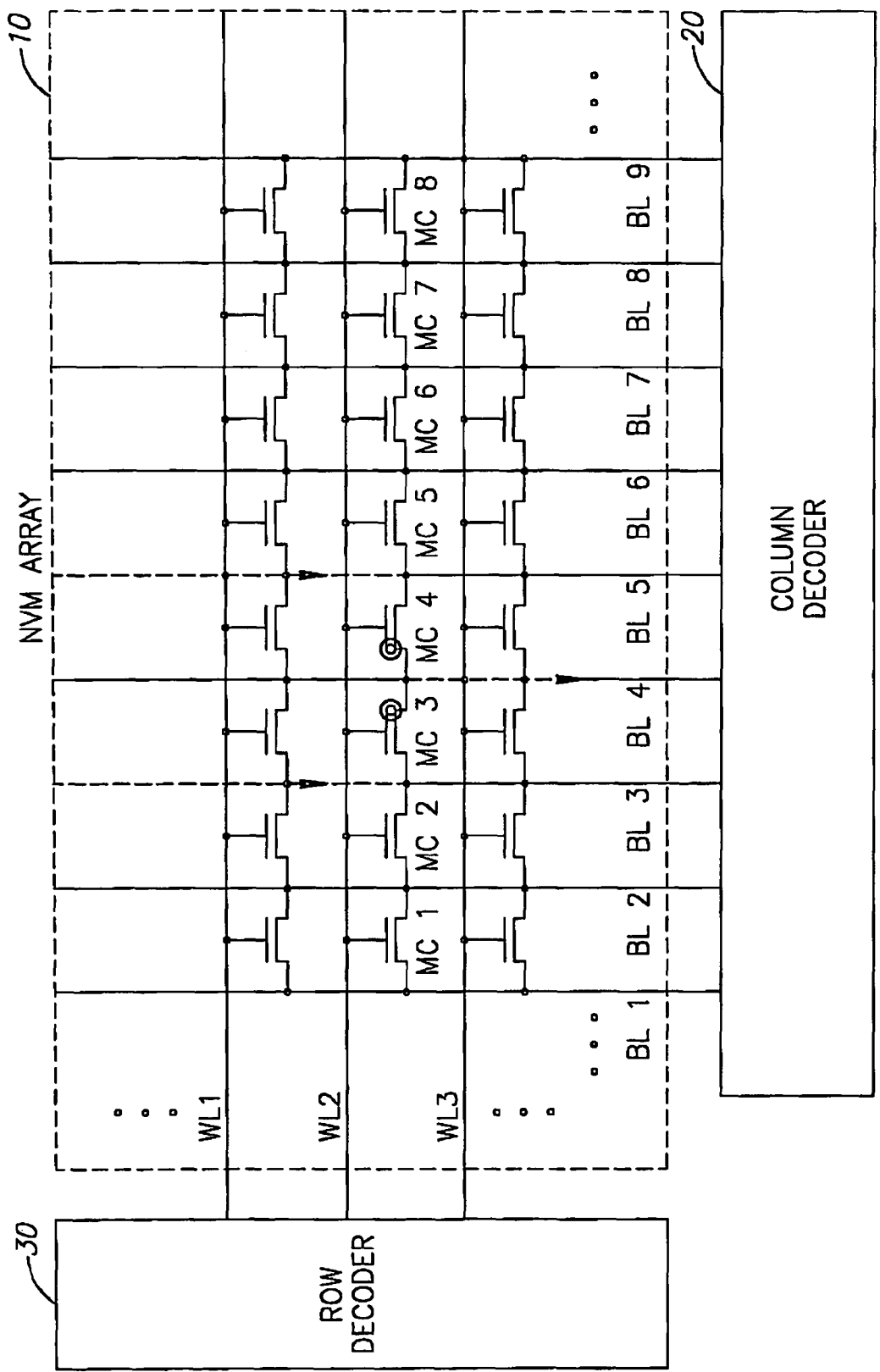
FIGS. 2A and 2B are simplified block diagrams of possible methods for read operation of memory cells in a VG NVM array in a two cell per bit configuration in accordance with an embodiment of the invention, where
Figure 2B:
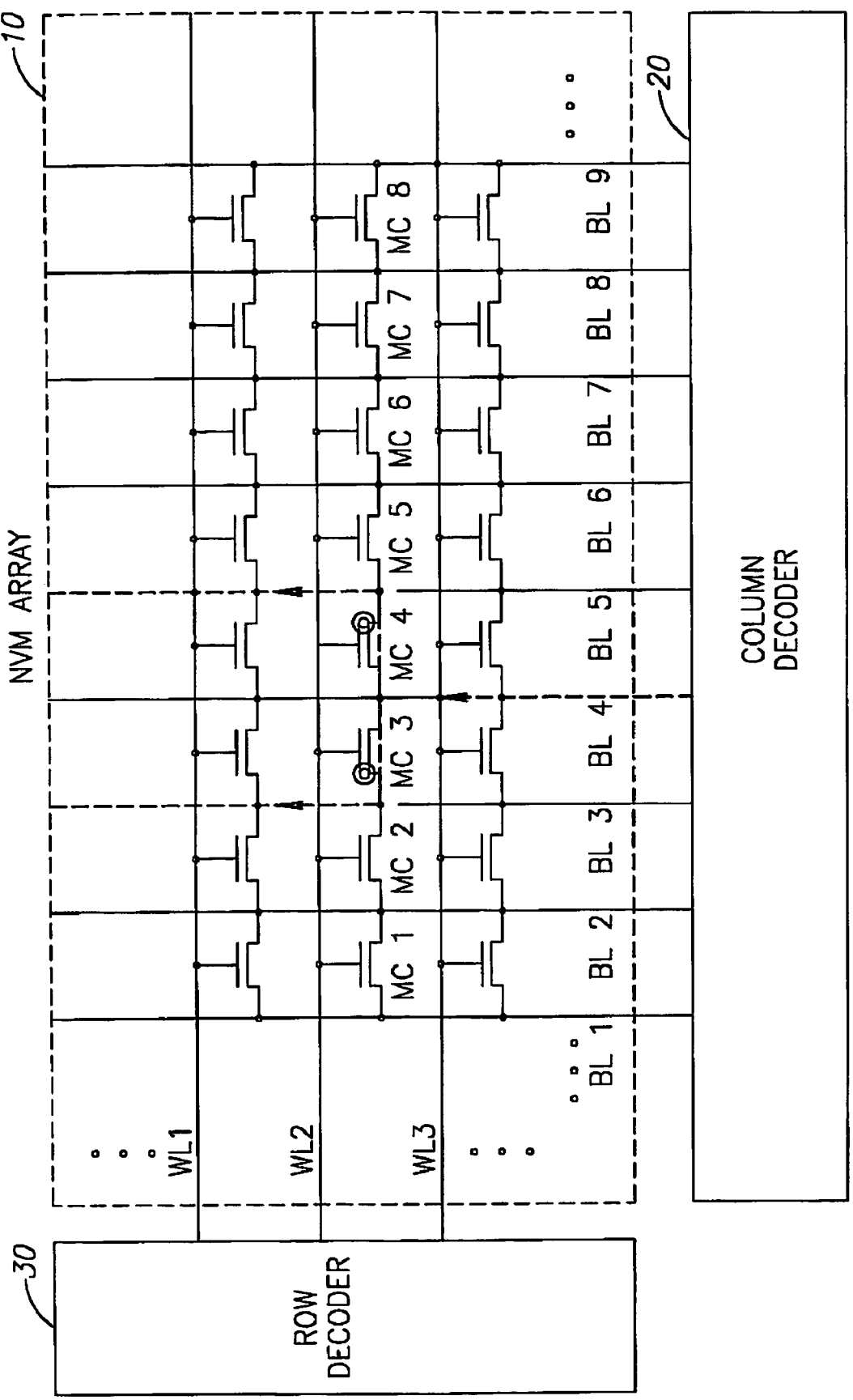

Reference is now made to FIGS. 2A and 2B which are block diagram illustrations of a group of memory cells in a VG NVM array 10 being read using possible methods for read operation in a two cell (i.e., one pair) per bit configuration in accordance with an embodiment of the invention. A suitable exemplary structure of an array that may be used in accordance with this invention is such as described in U.S. Pat. No. 5,963,465 or 6,633,496 which are incorporated by reference in their entireties, both of which are assigned to the same assignee as the present invention. The exemplary array may include a first plurality of word lines (WL), a second plurality of global bit lines (GBL) which may be metal, a third plurality of local bit lines (LBL) which may be formed by diffusion and a fourth plurality of select transistors.

In accordance with an embodiment of the present invention, memory cells $MC_1$ through $MC_8$ depicted in FIGS. 2A and 2B may be NROM cells. NROM cells are described in various publications, such as U.S. patent application Ser. No. 08/905,286, assigned to the same assignee as the present invention, the disclosure of which is incorporated herein by reference in its entirety. U.S. patent application Ser. No. 08/905,286 describes, inter alia, the steps of programming, reading and erasing NROM cells. U.S. patent application Ser. No. 09/730,586, also assigned to the same assignee as the present invention and incorporated herein by reference in its entirety, describes an additional method for programming and erasing an NROM array.

NROM cells operated in accordance with the present invention may be single bit cells or alternatively, they may store or represent more than one bit. In the latter case, for example, two individual bits, a left-side bit and a right-side bit, may be stored in physically different storage areas of the charge-trapping region layer associated with the cell. Moreover, each cell in accordance with the present invention may be a single level or multi-level cell. In the latter case, the storage areas within the cell may be programmed to different voltage levels.

FIG. 2A shows a plurality of bit lines $BL_{(1)}$ through $BL_{(B)}$, a plurality of word lines $WL_{(1)}$ through $WL_{(3)}$, a column decoder 20 that may include select transistors and additional peripheral devices, and a row decoder 30 that may include select transistors and additional peripheral devices. The following discussion assumes a close-to-ground read operation, such as that used for NROM cells and described in U.S. Pat. No. 6,128,226, and assigned to the same assignee of the present invention. However, this invention is also applicable for other, non-close-to-ground types of reads and to arrays of other types of memory cells.

According to an exemplary embodiment of the invention, a pair of adjacent cells such as $MC_3$ and $MC_4$ may be connected to the same word line $WL_{(2)}$ and share an inside common bit line, e.g., $BL_4$ in this example, which may be the reading node. The outside bit lines, $BL_3$ and $BL_5$ for the same example, may be coupled to a voltage source. The two adjacent cells $MC_3$ and $MC_4$ may hold the same data and may be read or sensed in parallel by the same sensing circuit (not shown). In accordance with this embodiment, there is substantially no NE in this configuration because the reading node has no neighbor cells. In addition, this configuration may provide approximately twice the current than the current in a single bit per cell read mode, which is described, for example, in U.S. Pat. No. 5,768,192, assigned to same assignee as the present invention.

The reading node may act as the source of the cells, e.g., for source-side read, shown in FIG. 2A, or as the drain of the cells, e.g., for drain-side read, shown in FIG. 2B. In the first case, the outside bit lines, $BL_3$ and $BL_5$, may be driven to a positive low voltage, e.g., in the range of 1-2V, while in the second case the outside bit lines may be grounded or brought close to ground. Driving of the outside or non-shared bit lines may be done either directly or through switches and the inside or shared reading node may be coupled directly or through switches to a sensing circuit that may determine the state of the cells being read.

In accordance with the embodiment depicted in FIGS. 2A and 2B, when the memory cells in the array are NROM cells, the cells may be used in a single bit mode. In general, NROM cells may preferably be reverse read, e.g., if programming is performed in one direction with a first bit line acting as the source, and a second bit line acting as the drain, then the read operation is performed in the reverse direction, e.g., with the second bit line acting as the source, and the first bit line acting as the drain. Thus, as shown in FIG. 2A, the cells may preferably store data in the storage areas close to the shared common bit lines $BL_4$ in the source side read case, or alternatively, as shown in FIG. 2B, in the storage areas close to the outside bit lines $BL_3$ and $BL_5$ in the drain side read case, as shown in FIG. 2B.

In accordance with the embodiment of FIG. 2B, in the drain-side read case, operation of NROM cells in a forward read configuration may also be applicable, whereby program and read may be performed in the same direction. Although doing so may require more aggressive programming, such a configuration may simplify the peripheral circuitry, for example column decoder 20 and row decoder 30, in particular.

It is worth noting that an important criterion in measuring performance of a memory array is access time. One of the factors determining the access time of a memory array is the level of the readout signal that a memory cell can develop during a certain time. This signal level should desirably be large enough in order to reliably sense the contents of the cell. The signal developed by the cell during sensing is typically a function of its current. Therefore, increasing the current of the cell may decrease its readout time. As such, one of the possible benefits of some embodiments of the present invention is an increase in cell current, and therefore, a reduction of readout time.

Figure 3A:
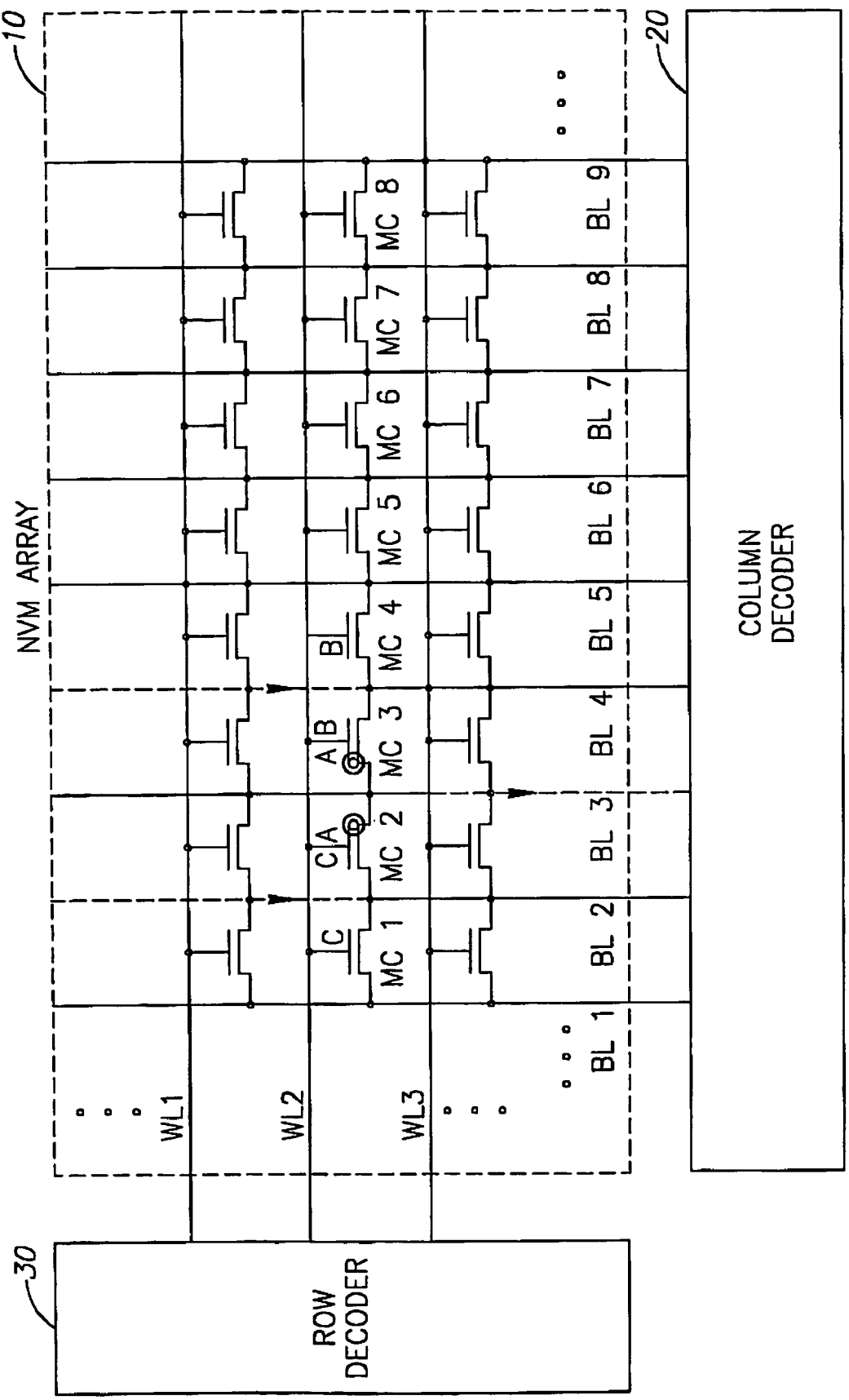
FIGS. 3A and 3B are block diagram illustrations of possible methods for read operation of memory cells in a VG NVM array in a two cell per two bits configuration in accordance with an embodiment of the invention, where
Figure 3B:
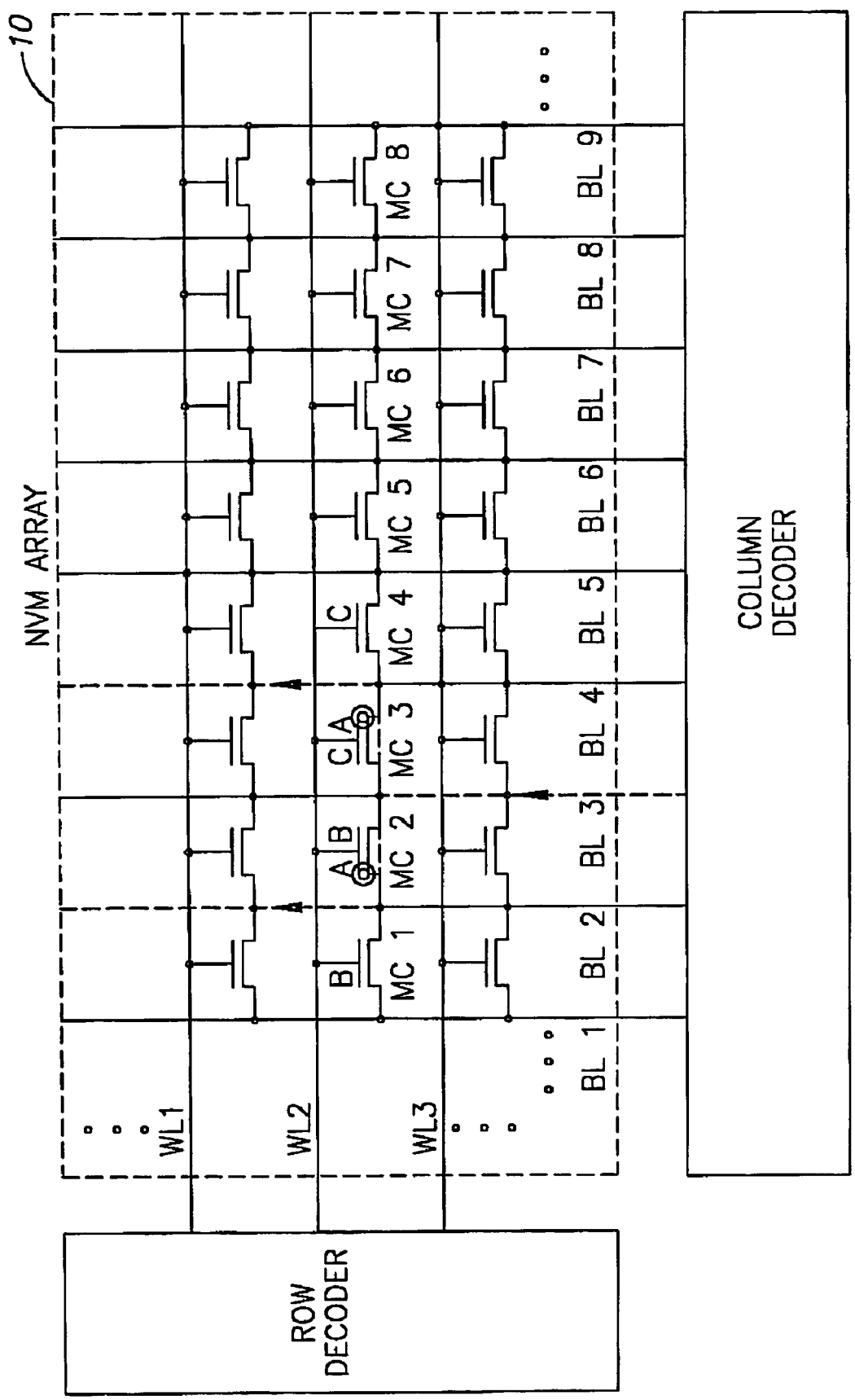

Reference is now made to FIGS. 3A and 3B which are block diagram illustrations of a group of memory cells in a VG NVM array 10 being read using possible methods for read operation in a two cell per two bits configuration in accordance with an embodiment of the invention. Components of the array of FIGS. 3A and 3B that are similar to those of FIGS. 2A and 2B are designated with the same reference labels, and the description is not repeated for the sake of brevity.

According to an embodiment of the invention, a pair of adjacent cells $MC_3$ and $MC_4$ may be on the same word line $WL_{(2)}$, the common bit line, $BL_4$ in this example may be the "reading" node, and the outside bit lines, $BL_3$ and $BL_5$ for the same example may be coupled to the same voltage source. The two adjacent cells $MC_3$ and $MC_4$ which may be accessed simultaneously may hold the same data and may be read concurrently. This configuration may provide approximately twice the current than the current in a "single cell per bit" case, which is described, for example, in U.S. Pat. No. 5,768, 192, assigned to same assignee of the present invention. In addition, in accordance with this embodiment, there is substantially no NE since the "reading" node is substantially unaffected by undesired current from neighbor cells.

In accordance with the embodiment of FIGS. 3A and 3B, an NROM cell may store two distinct bits of data, and may therefore, achieve twice the density, compared to the two cells per bit configuration. The operation of the NROM cells in this configuration may be a two bit per cell operation, whereby program and read may be performed in reverse directions.

FIG. 3A describes a method for source-side read operation of memory cells in a VG NVM array 10 in a two cell per two bits configuration in accordance with an embodiment of the invention. When adjacent cells $MC_2$ and $MC_3$ are source-side read, the data that may be read when accessing them may be stored on the first storage areas close to the common bit line $BL_3$. These first storage areas may be read substantially simultaneously and may contain substantially the same data. In accordance with this embodiment, the second storage areas of cells $MC_2$ and $MC_3$, e.g., the storage area close to the outside bit lines, $BL_2$ and $BL_4$, respectively, may correspond to the data read when accessing cells $MC_1$ and $MC_2$ or cells $MC_3$ and $MC_4$, respectively.

FIG. 3B describes a method for drain-side read operation of memory cells in a VG NVM array 10 in a two cell per two bits configuration in accordance with an embodiment of the invention. When adjacent cells $MC_2$ and $MC_3$ are drain-side read, the data that may be read when accessing them may be stored in the second storage areas close to the outside bit lines $BL_2$ and $BL_4$. These second storage areas may be read substantially at the same time and may contain substantially the same data. In accordance with this embodiment, the first storage areas of cells $MC_2$ and $MC_3$, e.g., close to the inside shared bit line $BL_3$, may correspond to the data that may be read when accessing cells $MC_1$ and $MC_2$ or $MC_3$ and $MC_4$, respectively.

In the source-side read operation the outside bit lines may be driven to a positive low voltage, e.g., in the range of 1-2V, while in the drain-side read operation the outside bit lines may be driven to ground or close to ground potential. The outside bit lines may be driven either directly or through switches and the reading node may be coupled directly or through switches to a sensing circuit that may determine the state of the cells being read.

Figure 4A:
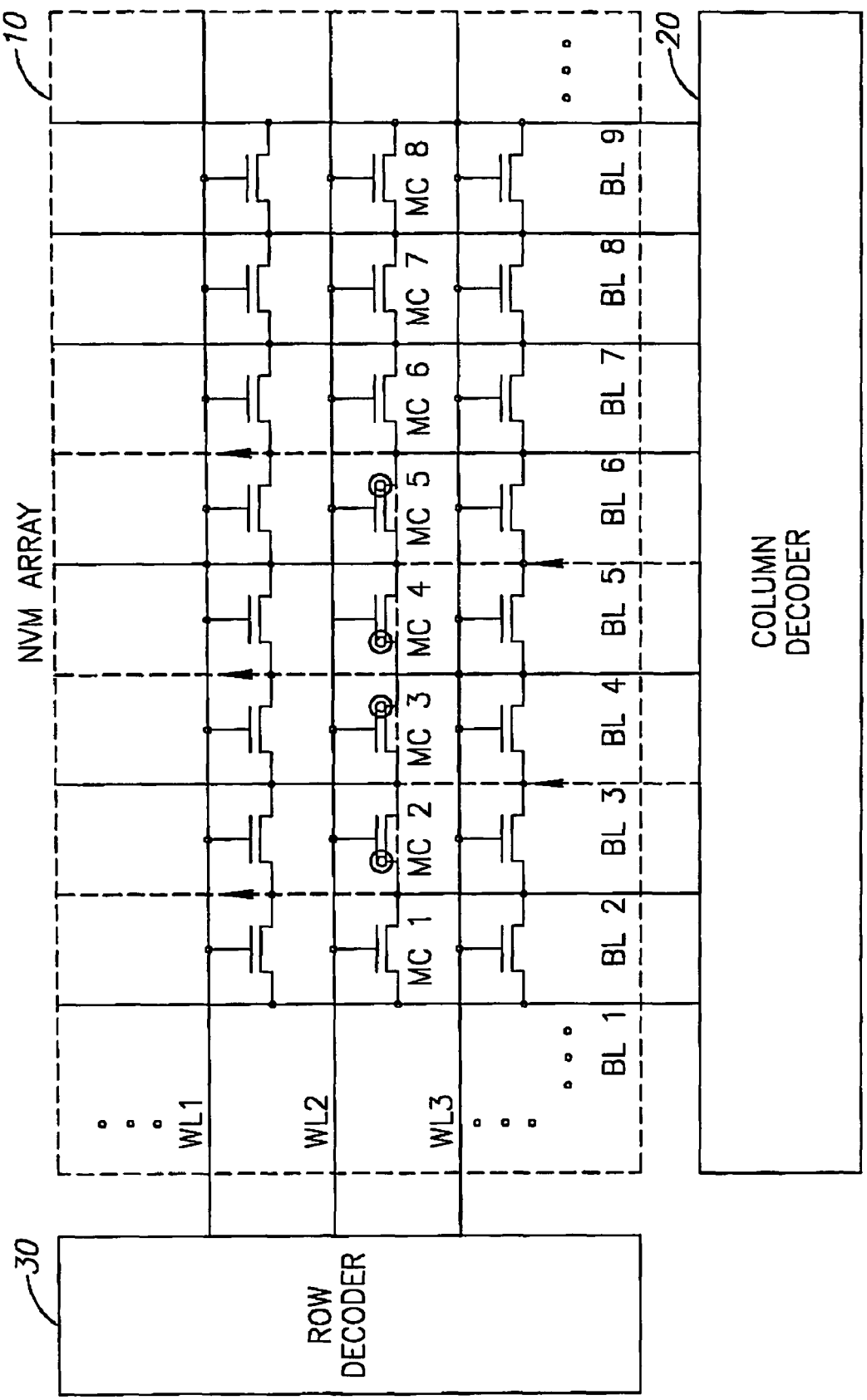
FIGS. 4A, 4B and 4C are block diagram illustrations of possible methods for read operation of memory cells in a VG NVM array in an N pairs of cells per one bit or per two bits configuration in accordance with an embodiment of the invention, where the cells in FIG. 4A are divided to N pairs that share the same word line, the cells in FIG. 4B are divided to N pairs that share the same bit line, and the cells in FIG. 4C are divided to N pairs that share a combination of word lines and bit lines.
Figure 4B:
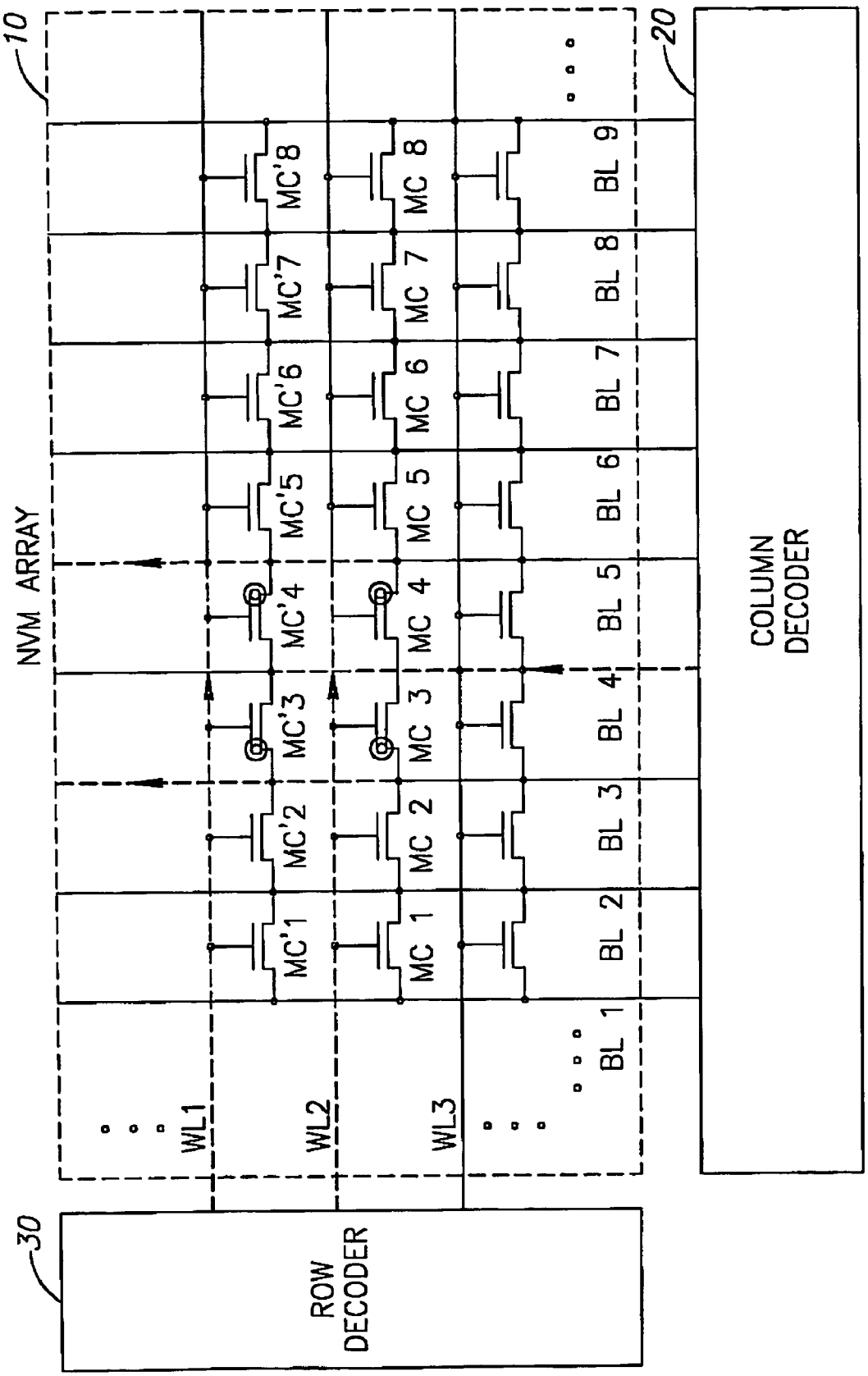
Figure 4C:
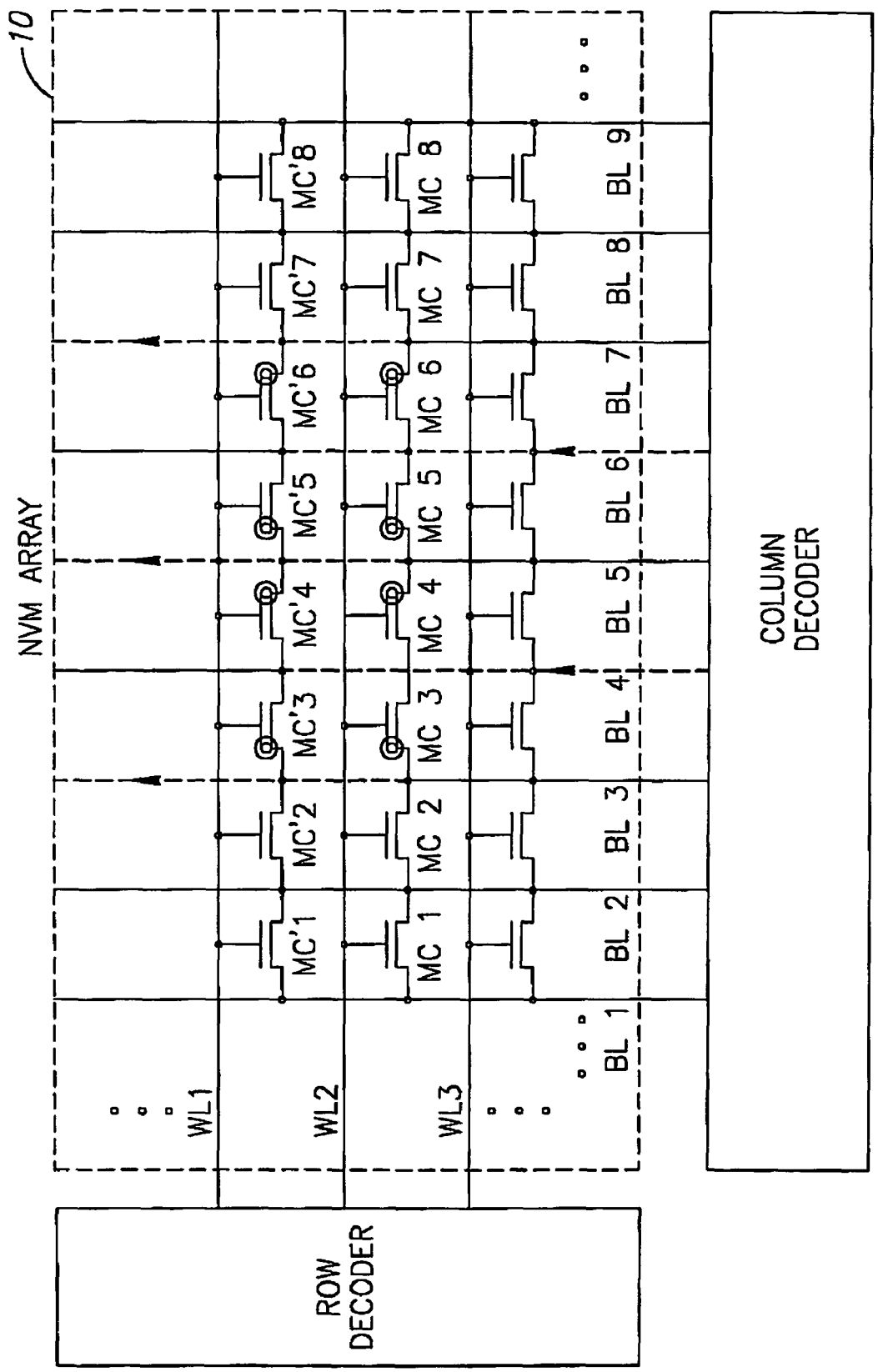

Reference is now made to FIGS. 4A-4C which are block diagram illustrations of a group of memory cells in a VG NVM array 10 being read using possible methods for read operation of memory cells in a VG NVM array in N pairs of cells per bit of data, or N pairs of cells per two bits of data in accordance with an embodiment of the invention. Components of the array of FIGS. 4A-4C that are similar to that of FIG. 2A are designated with the same reference labels, and the description is not repeated for the sake of brevity.

In accordance with the embodiment depicted in FIGS. 4A-4C, N pairs of adjacent cells in single bit mode or in two bit mode may be accessed and read substantially simultaneously. When the cells are operated in a single bit mode, the N pairs may store one bit of data, and when the cells are operated in two bits mode, the N pairs may store two bits of data.

The N pairs of adjacent cells may share the same word line, as shown in FIG. 4A, or the same reading bit lines and outside bit lines, as shown in FIG. 4B. Alternatively, the N pairs of adjacent cells may share a combination of word lines and bit lines, as shown in FIG. 4C.

Referring now to FIG. 4A, the N pairs of adjacent cells may share the same word line, e.g., $W_{(2)}$, the reading bit lines of all pairs, e.g., $BL_2$, $BL_4$, and $BL_6$ in, may be coupled, either directly or through switches, to a sensing circuit, and the adjacent bit lines of all pairs, e.g., $BL_3$ and $BL_5$ in, may be coupled together, either directly or through switches, and driven to the same voltage source.

Referring now to FIG. 4B, the N pairs of adjacent cells may share the same inside bit lines and outside bit lines, e.g., $MC_3$ and $MC_4$, and $MC'_3$ and $MC'_4$ may share $BL_3$ and $BL_5$, and the same word lines, e.g., $WL_{(2)}$ and $WL_{(1)}$. Accordingly, the bit lines and word lines connected to the pairs of cells may be driven substantially at the same time when accessing the pairs for read operation.

Referring now to FIG. 4C, a third configuration of this embodiment of the invention, the N pairs of adjacent cells may share a combination of word lines and bit lines. For the example of N=4, shown in FIG. 4C, a number, K, of the N pairs of cells, e.g., the two pairs of cells $MC_3$ to $MC_6$, may share the same word line, e.g., $WL_{(2)}$. N-K pairs of cells, e.g., two pairs of cells $MC'_3$ to $MC'_6$ may be placed on one or more word lines, e.g., $WL_{(1)}$ in FIG. 4C, and may share the same bit lines as the first K pairs. The reading bit lines, e.g., $BL_3$, $BL_5$, and $BL_7$ of the cells may be coupled together, either directly or through switches, to a sensing circuit. The adjacent bit lines of the cells divided to pairs, e.g., $BL_4$ and $BL_5$, and their word lines, $WL_{(2)}$ and $WL_{(1)}$, may be coupled together, either directly or through switches, and may be driven to the same voltage source.

In accordance with any of the described embodiments an increased amount of current may be sensed and the neighbor effect may be reduced or eliminated. Thus, a fast and reliable read operation may be achieved.

In an exemplary embodiment of the present invention, adjacent cells that are read together may be programmed and/or erased to be in the same state. It will be understood that the present invention may be practiced with any suitable method of programming and erasing cells. Thus, in accordance with an embodiment of the present invention the VG NVM array may be programmed by, for example, applying a series of programming pulses to either the drain or the gate of the pertinent memory cells in the array. For example, a programming pulse applied to the drain may initiate at an amplitude of 4.5V. A programming pulse applied to the gate may, for example, initiate at 8.0V.

In accordance with an embodiment of the present invention, a VG NVM array may be programmed by applying programming pulses to pairs of cells or combinations of pairs of cells in the VG NVM array simultaneously or in serial order. Thus, for example, in an embodiment of the present invention utilizing simultaneous programming of, for example, N pairs of cells, all 2N cells may be programmed simultaneously by identical programming pulses. Alternately, each of the N pairs of cells may be programmed individually. In another embodiment of the invention, a combination of the simultaneous and serial programming methods may be utilized. Thus, in such an embodiment, some of the N pairs of cells may be programmed simultaneously until all N pairs are programmed.

Figure 5:
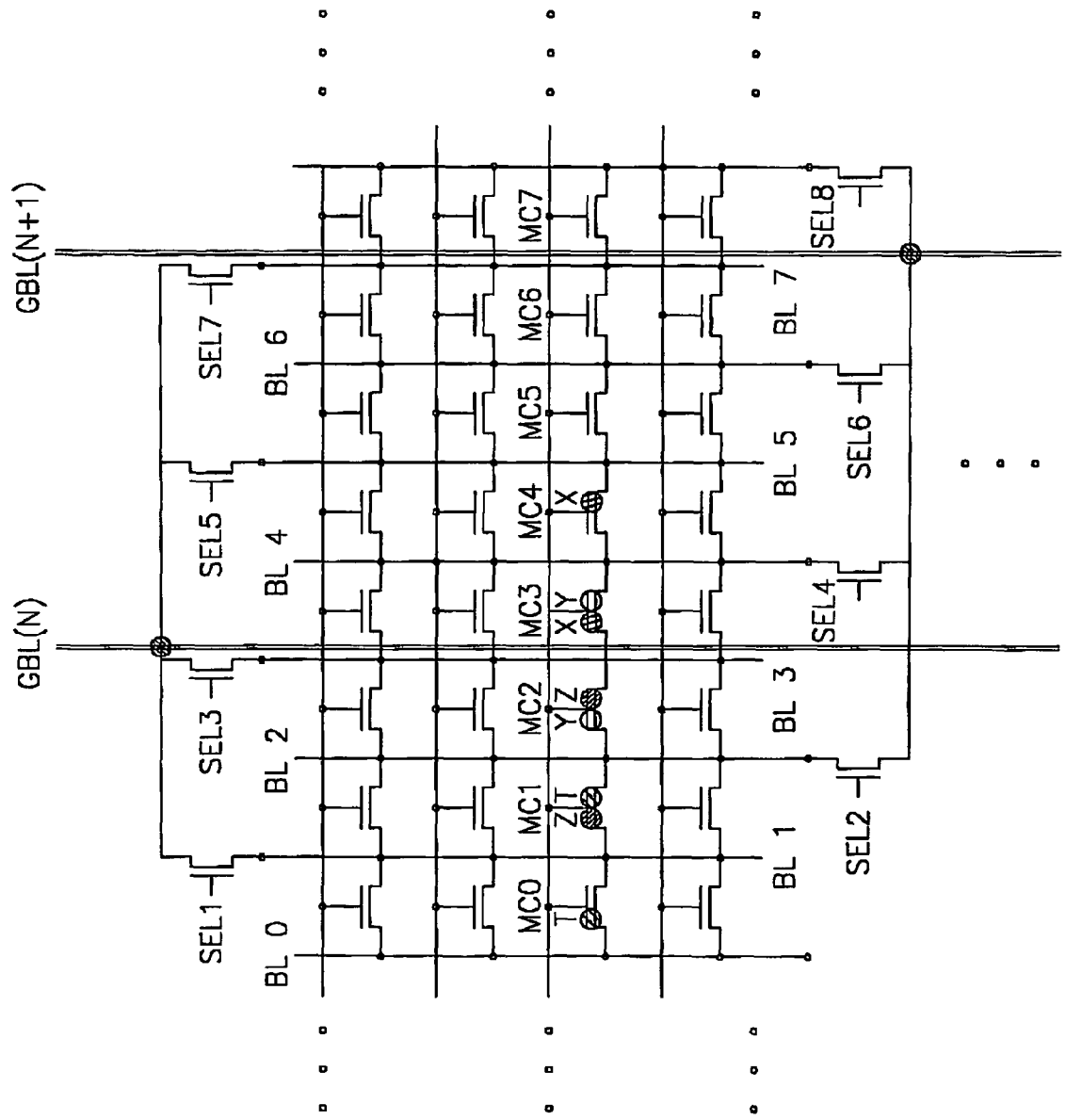
FIG. 5 is a block diagram illustration of a VG NVM array, operable in accordance with embodiments of the present invention.

Reference is now made to FIG. 5 which is a block diagram illustration of a VG NVM array, operable in accordance with embodiments of the present invention. The global bit lines (GBL) of the VG NVM array, e.g., $GBL_{(N)}$ and $GBL_{(N+1)}$, may be connected to local bit lines (LBL), e.g., $BL_0$ through $BL_7$, through select devices, $SEL_1$ through $SEL_7$. In accordance with this embodiment the local bit lines may serve as the local "reading" bit lines or as the bit lines that may be coupled to the same voltage source. The LBL's may be connected through the GBLs to peripheral circuits, sense amplifiers, or voltage drivers.

Figure 6:
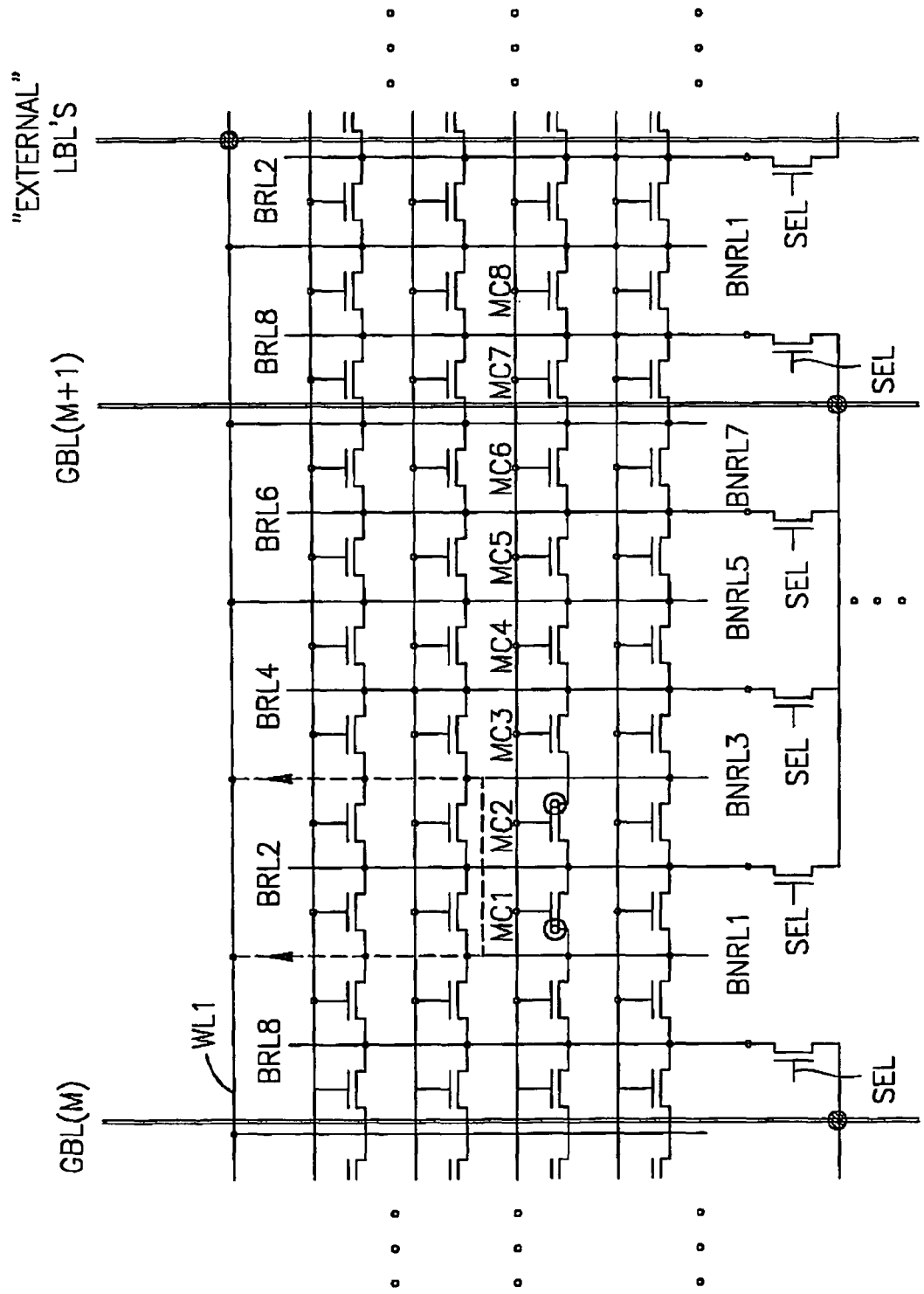
FIG. 6 is a block diagram illustration of a different configuration of a VG NVM array, operable in accordance with this embodiment of the present invention.

In accordance with an embodiment of the present invention, a portion of the LBLs that may be coupled to the same voltage source, e.g., the non-"reading" LBL's, may be coupled together without select devices. Thus, the size of the array may be reduced due to the reduced number of select devices. Reference is now made to FIG. 6 which is a block diagram illustration of a VG NVM array, operable in accordance with this embodiment of the present invention. In this configuration, the global bit lines (GBL) of the VG NVM array, e.g., $GBL_{(M)}$ and $GBL_{(M+1)}$, may be connected to the local bit lines that serve as the local "reading" bit lines, e.g., $BRL_2$, $BRL_4$, $BRL_6$, $BRL_5$ etc. In accordance with this embodiment the non-"reading" local bit lines, e.g., $BNRL_1$, $BNRL_3$, $BNRL_5$, $BNRL_7$ etc., may be coupled together to the same voltage source, for example, through $WL_1$.

It will be appreciated by persons skilled in the art that the present invention is not limited by what has been particularly shown and described herein above. For example, although particular array structure has been described in the particular method above, it will be understood that other array structures and configurations may be employed within the bounds of the invention, and that the invention is not limited in this regard. For example, floating gate transistors may be used instead of NROM cells, and the example in FIG. 4C may also be changed.

The invention claimed is:

1. A method of reading data in a virtual ground array of memory cells comprising: sensing substantially simultaneously a state of adjacent memory cells through at least a partially shared sensing path including a common sense amplifier, wherein sensing includes applying a first voltage to a common word line and a substantially similar voltage to bitlines on opposite sides of the adjacent cells.

2. The method of claim 1, wherein said sensing substantially simultaneously comprises: coupling said sense amplifier to a first source/drain terminal of each cell of said adjacent memory cells; setting a voltage at a second drain/source terminal of each cell of said adjacent cells to a read level; and sensing in a reading direction the state of said adjacent cells.

3. The method according to claim 1, wherein said adjacent cells share at least a word line.

4. The method according to claim 1, wherein said adjacent cells share at least an inside bit line.

5. The method according to claim 2, wherein said coupling a sense amplifier to a first source/drain further comprising coupling said sense amplifier to a shared bit line of said adjacent cells.

6. The method according to claim 1, wherein any one of said memory cells stores at least one bit in said charge trapping region.

7. The method according to claim 1, wherein said adjacent cells are sensed with substantially identical current.

8. The method according to claim 1, wherein said memory cells are nitride read only memory (NROM) cells.

9. The method according to claim 2, wherein said coupling a sense amplifier to a first source/drain further comprising coupling said sense amplifier through select transistors to said shared or not shared bit lines.

* * * * *